(12) United States Patent
Schwerin

(10) Patent No.: US 7,359,226 B2
(45) Date of Patent: Apr. 15, 2008

(54) TRANSISTOR, MEMORY CELL ARRAY AND METHOD FOR FORMING AND OPERATING A MEMORY DEVICE

(75) Inventor: Ulrike Gruening-von Schwerin, München (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/467,747

(22) Filed: Aug. 28, 2006

(65) Prior Publication Data

US 2008/0049486 A1   Feb. 28, 2008

(51) Int. Cl.
*G11C 15/00* (2006.01)
(52) U.S. Cl. .................. 365/49; 365/104; 257/296
(58) Field of Classification Search ........... 365/104, 365/63, 149, 49; 257/296–302
See application file for complete search history.

(56) References Cited

U.S. PATENT DOCUMENTS

| 6,902,942 | B2 * | 6/2005 | Wu et al. ............. 438/18 |
| 2005/0254279 | A1 * | 11/2005 | Schwerin ............. 365/63 |

2006/0113587 A1   6/2006   Thies et al.

FOREIGN PATENT DOCUMENTS

| DE | 102004021051 | 11/2005 |
| DE | 102005029493 | 2/2006 |
| DE | 102005046426 | 4/2006 |
| EP | 1097457 | 4/2003 |

\* cited by examiner

*Primary Examiner*—Anh Phung
*Assistant Examiner*—Hien Nguyen
(74) *Attorney, Agent, or Firm*—Dicke, Billig & Czaja PLLC

(57) ABSTRACT

A substrate forming an array of vertical transistor cells for selecting one of a plurality of memory cells and wherein each memory cell couples a transistor to a bit line via a memory element and is addressable by selecting two word lines and a bit line is disclosed. For minimizing the area of a cell and reducing complexity in production, one word line trench takes one word line, wherein in a first embodiment a first word line in a first word line trench forms a plurality of gate electrodes on one sidewall of active areas of a first and a second, adjacent row of transistor cells in word line direction, and wherein a second word line in an adjacent word line trench forms a plurality of gate electrodes on the opposite sidewall of active areas of the second and of a third row of transistor cells in wordline direction.

33 Claims, 9 Drawing Sheets

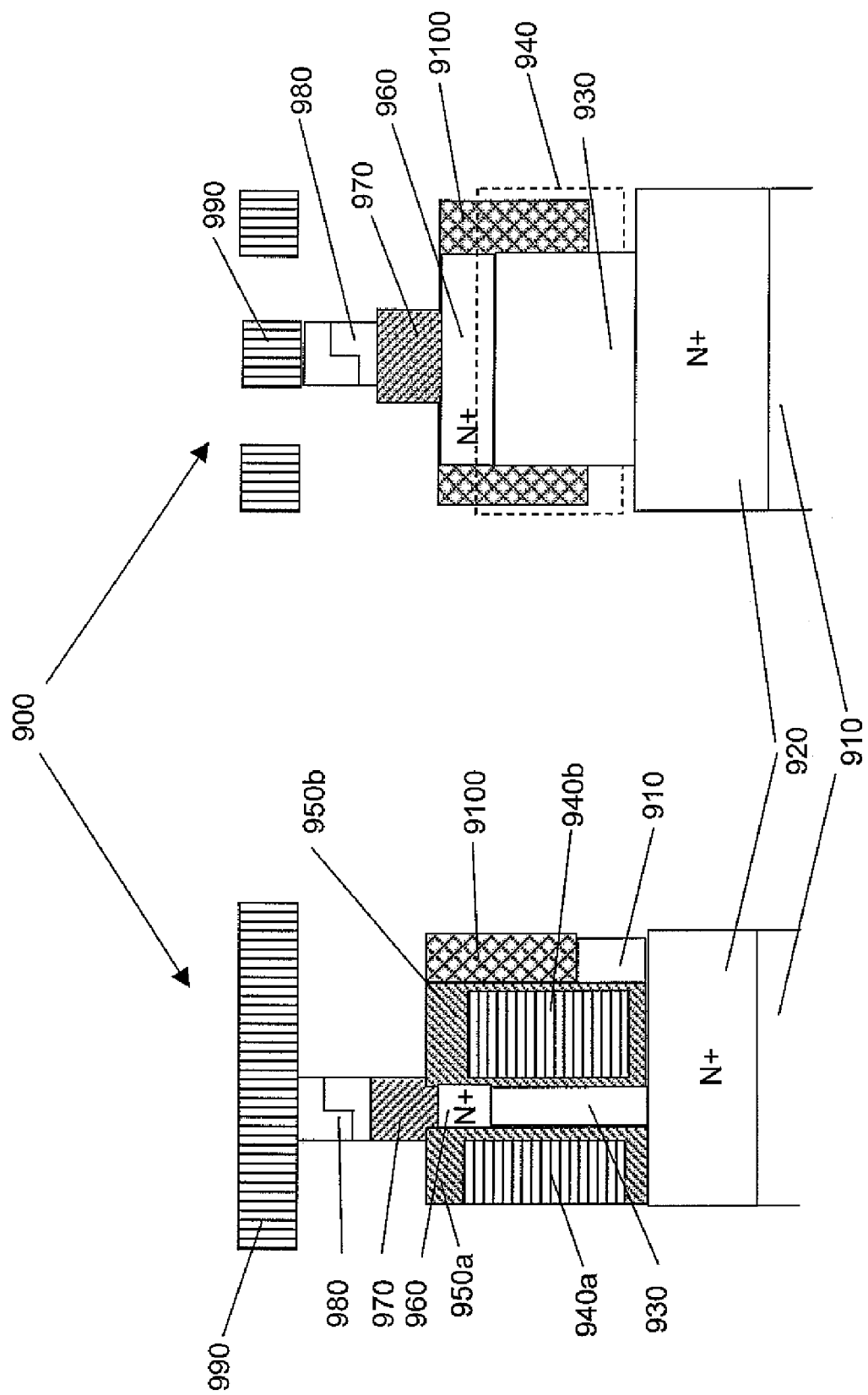

TRANSISTOR, MEMORY CELL ARRAY AND METHOD FOR FORMING AND OPERATING A MEMORY DEVICE

BACKGROUND

The invention relates to a transistor, a memory cell array and a method for forming and operating a memory device with at least one memory cell, in particular a resistively switching, e.g., a phase change memory cell, and to a memory device.

Conventional memory devices, in particular semiconductor memory devices, can be differentiated into a first group of functional memory devices, e.g., PLAs, PALs, etc., a second group of table memory devices, e.g., ROM devices such as PROMs, EPROMs, EEPROMs, flash memories, etc. Furthermore there is a third group of RAM devices, such as DRAMs and SRAMs.

Recently "resistive" or "resistively switching" memory devices have also become known, e.g., so called Phase Change Memories ("PCMs") or Conducting Bridge (CB) memories or magnetoresistive memories (MRAM) or resistive RAM (RRAM).

In a "resistive" or "resistively switching" memory cell, an "active" or "switching active" material, which usually is positioned between two suitable electrodes, i.e. an anode and a cathode, can be switched between a conductive and a less conductive state by an appropriate switching process. The conductive state can be assigned a logic one and the less conductive state can be assigned a logic zero, or vice versa, which may, for instance, correspond to the logic arrangement of a bit.

For phase change memories (PCRAMs), for instance, an appropriate chalcogenide compound, for example Ge—Sb—Te (GST) or an In—Sb—Te compound, may be used as a "switching active" material that is positioned between two corresponding electrodes. This "switching active", e.g., the chalcogenide material, can be switched between an amorphous and a crystalline state, wherein the amorphous state is the relatively weakly conducting state, which accordingly can be assigned a logic zero, and the crystalline state, i.e. a relatively strongly conductive state, accordingly can be assigned a logic one. In the following this material will be referred to as the switching active material.

To achieve a change from the amorphous, i.e. a relatively weakly conductive state of the switching active material, to a crystalline, i.e. a relatively strongly conductive state, the material has to be heated. For this purpose a heating current pulse is sent through material, which heats the switching active material beyond its crystallization temperature thus lowering its resistance. In this way the value of a memory cell can be set to a first logic state.

Vice versa, the switching material can be heated by applying a relatively high current to the cell which causes the switching active material to melt and by "quench cooling" the material can brought into an amorphous, i.e. relatively weakly conductive state, which may be assigned a second logic state, that is to reset the first logic state.

Various concepts have been proposed for PCRAM cells, for example from S. J. Ahn, "Highly Manufacturable High Density Phase Change Memory of 64 MB and Beyond", IEDM 2004, and H. Horii et al. "A novel cell technology using N-doped GeSbTe films for phase change RAM", VLSI, 2003, and Y. N. Hwang et al "Full integration and reliability evaluation of phase-change RAM based on 0.24 um-CMOS technologies", VLSI, 2003, and S. Lai et al "OUM—a 180 nm non-volatile memory cell element technology for stand alone and embedded applications", IEDM 2001, or the edge contact cell by Y. H. Ha et al "An edge contact cell type cell for phase change RAM featuring very low power consumption", VLSI, 2003.

To be cost competitive a small cell size is required allowing a high density of memory cells in a memory cell array.

A disadvantage of the proposed memory cells is the use of planar array transistors or transistors having the source/drain contacts in the same horizontal plane, for example FinFETs. Such a design prohibits shrinking the cell size below 6F2 for geometrical reasons, because the size of a cell includes the area needed for the transistor to select the cell.

US2005/0001257A1 discloses a DRAM memory cell having vertical transistor cells formed in a substrate including lower source/drain regions connected to a common connection plate. Upper source/drain regions of the transistor cells impart a contact connection to a storage capacitor. The array of transistor cells is formed by wordline trenches, wherein the wordlines in the trenches form gate electrodes of the transistors, and by isolation trenches (STI) running perpendicular to the wordline trenches. A disadvantage of the proposed structure is the need to accommodate and form two electrically isolated spacer wordlines in one wordline trench.

Consequently it is desirable to provide a novel design of a selection transistor for a memory device with a plurality of memory cells, in particular phase change memory cells, and a corresponding method for forming the transistors avoiding the abovementioned problems.

For these and other reasons, there is a need for the present invention.

SUMMARY

In one embodiment, the invention provides an array of vertical transistors in a substrate for selecting one of a plurality of memory cells, each memory cell coupling a transistor cell to a bit line via a memory element and being addressable by selecting two word lines and the bit line, the array of vertical transistors defined by a plurality of word line trenches and a plurality of crossing, perpendicular insulation trenches in the substrate, the word line trenches separating transistor cells in the direction of insulation trenches and the insulation trenches separating transistor cells in the direction of word line trenches, wherein one word line trench takes one word line, and wherein a first word line in a first word line trench forms a plurality of gate electrodes on one sidewall of active areas of a first and a second, adjacent row of transistor cells in word line direction, and wherein a second word line in an adjacent word line trench forms a plurality of gate electrodes on the opposite sidewall of active areas of the second and of a third row of transistor cells in wordline direction.

Another embodiment of the invention is directed at an array of vertical transistors in a substrate for selecting one of a plurality of memory cells, each memory cell coupling a transistor cell to a bit line via a memory element and being addressable by selecting two word lines and the bit line, the array of vertical transistors defined by a plurality of word line trenches and a plurality of crossing, perpendicular insulation trenches in the substrate, the word line trenches separating transistor cells in the direction of insulation trenches and the insulation trenches separating transistor cells in the direction of word line trenches, wherein one word line trench takes one line of gate electrodes of one line of adjacent transistor cells in wordline direction, the gate electrodes being electrically coupled to a gate conductor positioned above the wordline trench, wherein a first line of gate electrodes in a first word line trench forms a plurality of gate electrodes on one sidewall of active areas of a first and a second, adjacent row of transistor cells in word line direction, and wherein a second line of gate electrodes in an adjacent word line trench forms a plurality of gate electrodes on the opposite sidewall of active areas of the second and of a third row of transistor cells in wordline direction.

The invention proposes a method for producing an array of vertical transistor cells in a substrate including the following method processes: providing a conductive layer within the substrate, the conductive layer covered by a less conductive and at least partially oppositely doped substrate layer;

forming a plurality of parallel insulation trenches extending along a first direction and filling the insulation trenches with an insulating material;

forming a plurality of parallel wordline trenches extending along a second direction perpendicular to the first direction thus forming pillars of substrate material emerging from the substrate and serving as active areas of the transistor cells; producing a layer of gate dielectric in a first wordline trench and filling with a conductive material thus forming gate electrodes at a sidewall of a first and of a second, adjacent line of active areas in wordline direction thus forming a wordline; producing a layer of gate dielectric in at least a second, adjacent wordline trench and filling with a conductive material thus forming gate electrodes at an opposite sidewall of the first line of active areas and at a sidewall of a third, adjacent line of active areas in wordline direction thus forming a second, adjacent wordline.

In another embodiment the invention proposes a method for producing an array of vertical transistor cells in a substrate including the following method processes: providing a conductive layer within the substrate, the conductive layer covered by a less conductive substrate layer;

forming a plurality of parallel insulation trenches extending along a first direction and filling the insulation trenches with an insulating material; forming a plurality of parallel wordline trenches extending along a second direction perpendicular to the first direction thus forming pillars of substrate material emerging from the conductive layer within the substrate and serving as active areas of the transistor cells;

producing a layer of gate dielectric in a first wordline trench and filling with a conductive material thus forming gate electrodes at a sidewall of a first and of a second, adjacent line of active areas in wordline direction thus forming a wordline;

producing a layer of gate dielectric in at least a second, adjacent wordline trench and filling with a conductive material thus forming gate electrodes at an opposite sidewall of the first line of active areas and at a sidewall of a third, adjacent line of active areas in wordline direction thus forming a second, adjacent word line.

A method of driving a double gate transistor is described, the transistor including an active area, a first gate electrode located on a first sidewall of the active area and a second gate electrode located at an opposite sidewall of the active area, the first gate electrode coupled to a first word line and the second gate electrode coupled to a second word line, wherein the transistor has first state being defined by a first voltage potential applied to both word lines opening the transistor, a second state defined by the first voltage potential being applied to the first word line and a second voltage potential being applied to the second word line to lower the conductivity of the transistor by at least one order of magnitude.

Also a method of driving a first and a second, adjacent double gate transistor in an array of double gate transistors is proposed, the first double gate transistor including a first gate electrode coupled to a first word line and a second gate electrode coupled to a second word line, the second double gate transistor including a first gate electrode coupled third word line and a second gate electrode coupled to the second word line, the first and second transistors thus sharing the gate electrode coupled to the second word line, wherein when opening the first transistor a positive gate voltage is applied to the first and second word line and a ground or negative voltage is applied to the third word line thus closing the second transistor.

In another embodiment an array of transistors in a substrate for selecting one of a plurality of memory cells is described, each memory cell coupling a transistor to a bit line via a memory element and being addressable by selecting a pair of word lines and one perpendicular bit line, the array of transistors formed by a plurality of word line trenches forming stripes of substrate material serving as active areas of the transistors, the stripes separated by pieces of insulation trenches, thus the word lines trenches separating transistor cells in a first direction and the pieces of insulation trenches separating transistor cells in the direction of word line trenches, wherein one word line trench takes one word line, and wherein a first word line of a pair forming a plurality of gate electrodes on one sidewall of active areas of a row of transistor cells in word line direction, the other word line of the pair forming a plurality of gate electrodes on the opposite sidewall of the active areas of the row of transistor cells in word line direction, and wherein the transistors are located at every second crossing point of a pair of word lines and a bit line, whereby transistors in an adjacent row are arranged staggered by one bit line, the transistors thus arranged like on a checkerboard.

Further features and advantages of the present invention will become apparent from the following detailed description of the invention made with reference to the accompanying drawings.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 9a and 9b illustrate schematic cross sectional views of the alternative

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
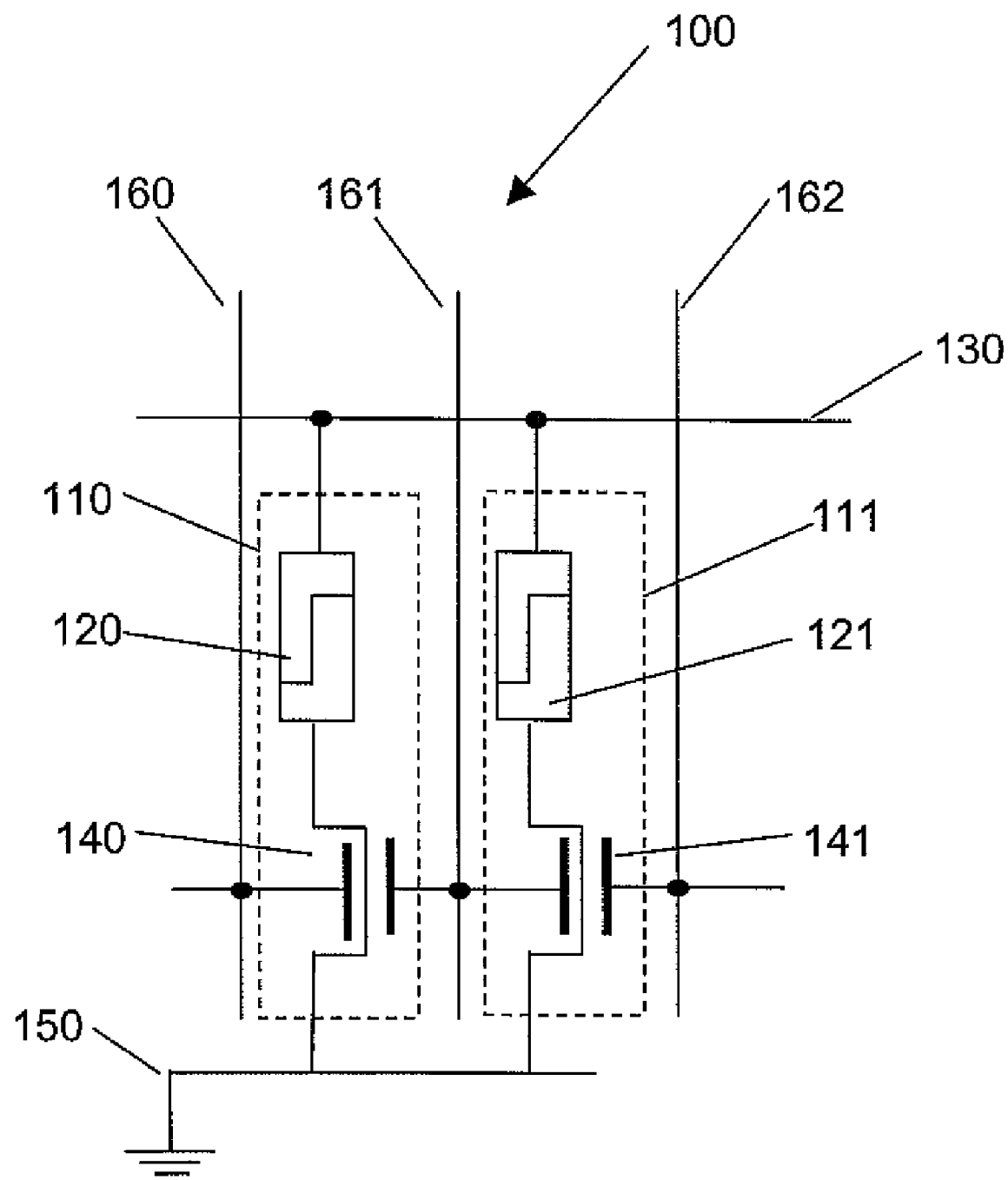
FIG. 1 illustrates a schematic circuit diagram of an array of memory cells.

FIG. 1 illustrates a schematic circuit 100 of an array of memory cells, exemplified by a first and an identical second memory cell surrounded by the dotted lines 110 and 111 respectively.

Each first memory cell includes a resistively switching element 120, 121 being coupled to a bitline 130 and to the drain of a selection transistor 140 and 141 respectively. The selection transistors 140, 141 are each coupled with its source to source potential, namely to a source line 150, wherein the source potential can be ground potential, the source line 150 consequently a ground line. All selection transistors in this array of memory cells are coupled with their source to a single source line 150 being in this embodiment a plate. In this way a memory cell couples a transistor to a bit line via a resistively switching memory element.

The selection transistors 140, 141 are double gate transistors as indicated, wherein each of the gates of a transistor is coupled to a different wordline, i.e. the first gate—on the left hand side of transistor 140—is galvanically coupled to a first wordline 160 and the second gate—on the right hand side of transistor 140—is galvanically coupled to a second wordline 161. Consequently in order to fully open transistor 140 that is by applying an appropriate gate voltage to both gates the gate voltage must be applied to two wordlines, namely wordline 160 and 161.

The selection transistors 140, 141 are vertical transistors, wherein "vertical" describes that—with the wafer surface as a horizontal reference plane—a substantial part of the current flow is vertical or in other words the drain is arranged substantially above the body region where the conductive channel is formed which in turn is substantially arranged above the source of a transistor.

The opposing gates of two adjacent transistors being coupled to the same bitline 130 are coupled to the same wordline, i.e. the gate on the right hand side of transistor 140 and the gate on the left hand side of transistor 141 are coupled to wordline 161. So if transistor 140 is opened by applying appropriate gate voltages to wordlines 160 and 161, then at the same time the gate voltage is applied to one gate of transistor 141.

In one embodiment, the transistors are fully depleted, i.e. the depletion zones induced by the left and right hand gate electrodes in the active transistor area overlap. For fully depleted n-type double gate transistors a positive voltage above the threshold voltage must be applied to both gates to turn the transistor on. If only one gate electrode is raised high, that is a gate voltage above the threshold voltage of the double gate transistor is applied to only one of the gate electrodes, then the transistor is operated as a backgate controlled transistor, i.e. the effective threshold voltage is dependent on the voltage applied to the other (back) gate electrode, the threshold voltage decreasing with increased voltage applied to the backgate. In this way, the threshold voltage of the transistor can be raised by applying a zero or even negative voltage to one of the gate electrodes and the transistor is not fully switched into the conducting state resulting in a considerably lower current flow. In case there is a voltage sufficiently below the threshold voltage, which can be ground potential or a negative voltage, applied to both gate electrodes the transistor is turned off leading to a negligible current.

When writing a cell, that is when setting or resetting a cell by sending a comparatively high current pulse through the volume of resistively switching material, the two corresponding wordlines must be raised high to turn on its selection transistor. So for writing the first cell 110, the wordlines 160 and 161 must be raised high to turn on selection transistor 140 and the voltage of the bitline 130 must be raised to an appropriate voltage so that a current pulse will flow through the resistively switching element 120.

Due to the voltage applied to the wordlines 160 and 161a voltage is also applied to one gate of the selection transistors of adjacent memory cells. However, as the opposite gate electrode of the adjacent memory cells is held low, that is at ground or an even lower potential, the current flow through the selection transistors of the adjacent memory cells is below the writing threshold the current flowing through these cells thus leaving them unmodified.

When reading a memory cell, the worst case is that the selected cell is in high resistance state, whereas the adjacent memory cells connected to the same bitline are in a low resistance state. So in order to minimize the current flowing through the adjacent memory cells, the selection transistors are designed such that when reading a cell, the selection transistors of adjacent memory cells operate in the sub threshold regime so that the resistance of a transistor can be increased by at least 1-2 orders of magnitude so that the signal margin is large enough for being detected safely.

Another embodiment of the described memory cell having two gate electrodes coupled to electrically independent wordlines is that two different voltages can be applied to the two gates electrodes of one selection transistor.

The two memory cells of FIG. 1 are representative for a plurality of memory cells connected to one bitline thus forming a row of memory cells. A plurality of these rows can be integrated in a single memory device including a plurality of bitlines and wordlines, wherein one memory cell can be selected by selecting the two corresponding wordlines and the corresponding bitline.

Figure 2:
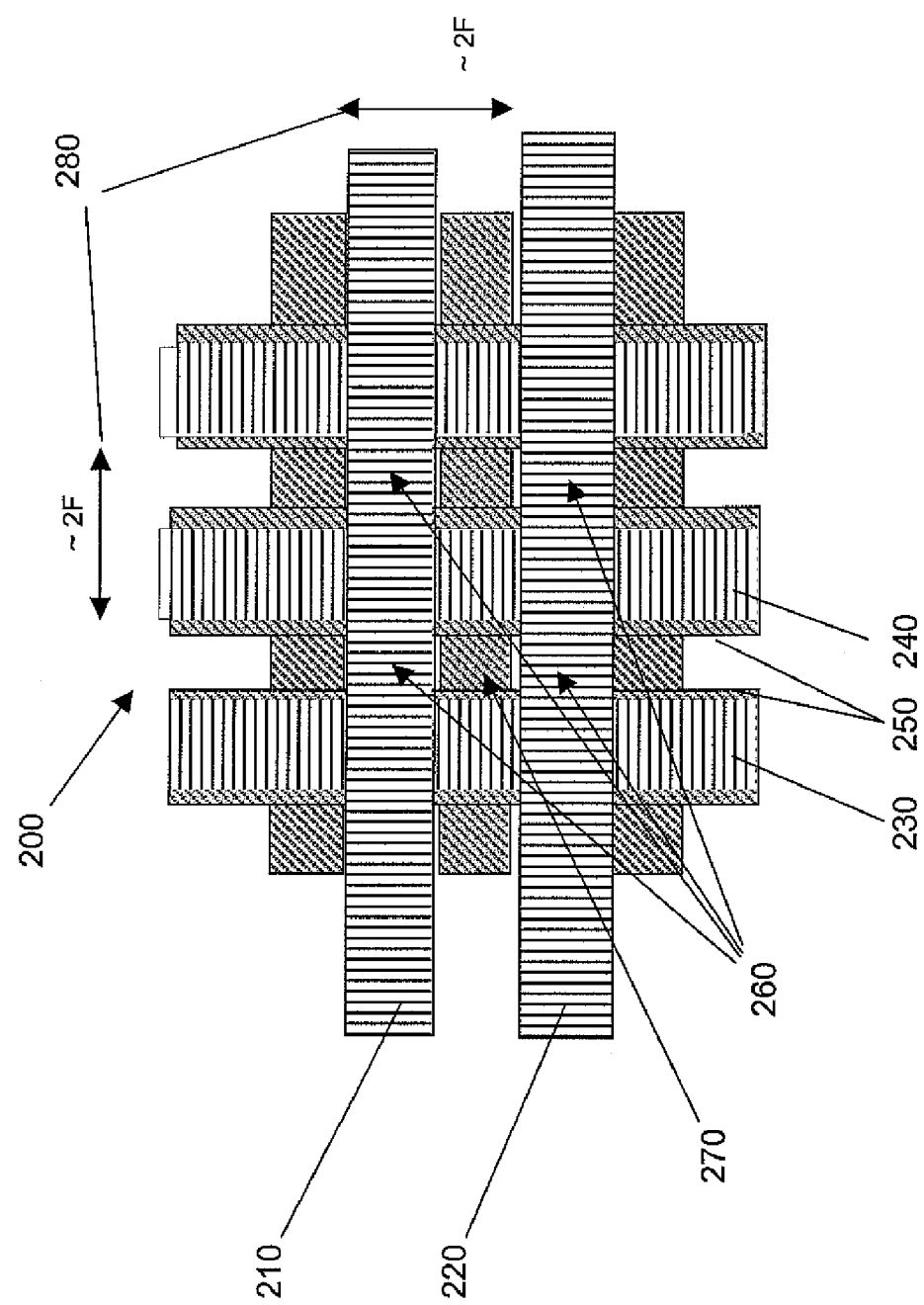
FIG. 2 illustrates a schematic top-down view of an array layout of double gate cells.

FIG. 2 is a schematic top-down view onto a cutout of a layout of an array of memory cells 200 including double gate selection transistors. Volumes of resistively switching material are not illustrated, as they are hidden by the bitlines.

Also isolation material, into which for example the bitlines are embedded, is illustrated only where essential. Furthermore the source plate, onto which the structure is formed, is omitted, as well as further metallization levels above the bitline.

A first and a second bit line 210, 220 being the topmost elements in this top-down view are exemplified. A plurality of identical bit lines is positioned adjacent and parallel to these. As will be explained in more detail in the following description, the bit lines are located above the surface plane of the original wafer.

Reference signs 230 and 240 denote a first and a second wordline, which exemplify a plurality of parallel wordlines. The wordlines 230, 240 are located below the bitlines 210, 220 and at least partially below the surface plane of the original wafer, so that the wordlines are buried below the surface plane of the original wafer.

The sidewalls of the wordlines are covered by a layer of insulating oxide 250, which forms the gate oxide of selection transistors. Thus each wordline forms a plurality of gate electrodes of selection transistors. The active areas of the transistors, namely the source, drain and body of a selection transistor, are located—indicated by arrow 260—under the bitlines and between a pair of wordlines.

The areas between the bitlines and also between the wordlines—referenced by arrow 270—are filled with an insulating material forming a shallow trench isolation (STI).

Even though the drawing is not drawn to scale reference numeral 260 denotes arrows showing the periodicity of the bitlines 210, 220 and wordlines 230, 240 being 2F each, wherein F denotes the minimum feature size defined by conventional manufacturing methods. Consequently the cell size is 4F2.

While this concept is explicated with a phase change cell, it is not limited to phase change memory cells but can be applied to all resistive 1TnR memory concepts allowing the same cell architecture, i.e. cells having the bitline connected to the storage element directly and the transistor sources coupled to a common (ground) potential.

It is to be noted that an array layout as illustrated in FIG. 2 can be achieved by two different structures, namely by a first embodiment including a buried wordline or a second structure including a conventional wordline. Both embodiments will be described in more detail below.

Figure 3:
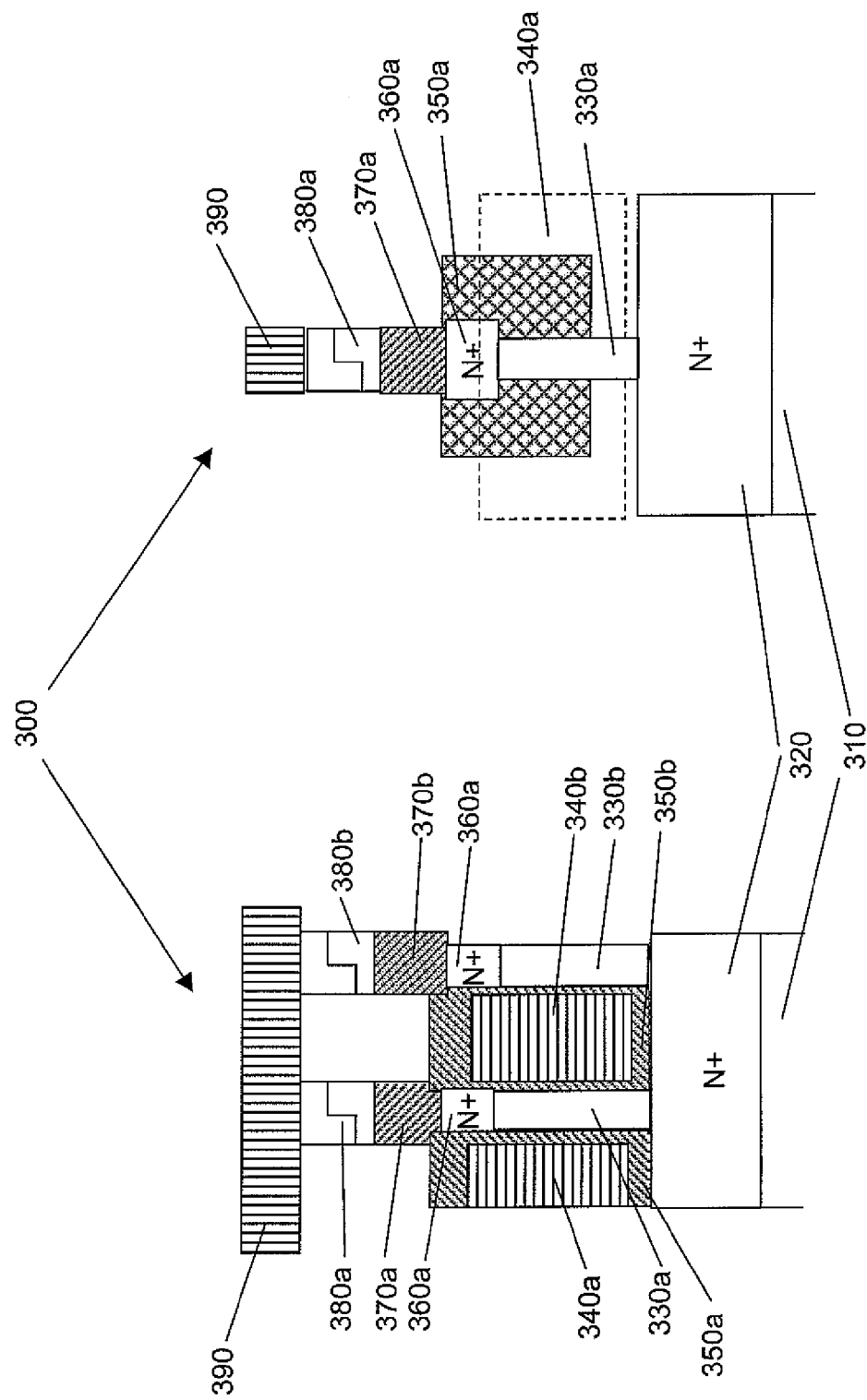
FIGS. 3a and 3b illustrate schematic cross sectional views of a memory cell.

FIG. 3*a* illustrates a cross-section through two memory cells 300, wherein the direction of the cut line is parallel to a bitline.

The following description is for an n-type transistor. Even if not described here, the transistor could also be formed as p-type transistor with adapted doping and voltages.

In a wafer 310 a plate 320 of N+ doped semi-conducting material is coupled to ground potential and serves as a ground line. In the following description also throughout the description the surface of this plate 320 is used as a horizontal reference plane as it is comprised in each drawing.

In the drawing two active area regions 330*a* and 330*b* of two corresponding selection transistors are illustrated. The drain 360*a*, 360*b*—N+ doped Si—of a selection transistor is positioned at the top of active area region 330*a*, 330*b*. At the lower end of the active area region, the source region of the selection transistor is formed which is part of or directly coupled to the plate 320. Between the n+-doped source 320 and the drain region 360, the transistor body is located. The material of the bodies is p-type doped.

There are two gate electrodes 340*a* and 340*b*, which form the gate electrodes at both sidewalls of the active areas 330*a*, so that this transistor is a double gate transistor. Each gate electrode 340*a*, 340*b* is electrically insulated by a gate oxide layer 350*a*, 350*b* against the active area 330*a*.

Gate electrode 340*a* furthermore serves as one of two gate electrodes also for a transistor—not illustrated—adjacent on the left hand side of the drawing being the gate electrode on the right sidewall of a corresponding active area. Also gate electrode 340*b* serves as one of two gate electrodes of a transistor including active area 330*b*, whereby the gate electrode on the right hand side of active area 330*b* is not illustrated in the drawing. Consequently each gate electrode serves as gate electrode for two adjacent transistors, the corresponding memory cells being coupled to one bit line 390.

As mentioned above the gate electrodes on one sidewall of the active areas of transistors are galvanically coupled, in particular the coupled gate electrodes on one sidewall of active areas form a wordline. That is, in FIG. 3*a* the gate electrode 340*a* is coupled to the adjacent gate electrodes located in front of and also to the adjacent gate electrodes located behind the paper plane, so that these gate electrodes form a wordline running into the paper plane. Similarly gate electrode 340*b* located on the opposite side of active area 330*a* is coupled to adjacent gate electrodes—not illustrated—located in front of and behind the paper plane thus forming another wordline also running into the paper plane.

Consequently for driving the transistor cell including the active area 330*a* a gate voltage is applied to two wordlines, namely those forming the gate electrodes at opposing sidewalls of the active area 330*a*.

The drain 360*a*, 360*b* is coupled to a bottom electrode contact 370*a*, 370*b* of a memory cell, the bottom electrode contact in turn placed on the drain and coupled to a volume of switching active material 380*a*, 380*b*. A volume of switching active material 380*a*, 380*b* in turn is placed on top of a bottom electrode 370*a*, 370*b* and coupled to a bitline 390 placed on top of the volumes of switching active material.

According to the direction of the cut line in the drawing both volumes 380*a*, 380*b* of switching active material are coupled directly to one bitline 390. These volumes exemplify a plurality of volumes of switching active material coupled directly to one bitline.

Turning now to FIG. 3*b* a cross section through the structure with a cut line perpendicular to a bitline, i.e. in the direction of a wordline, is illustrated.

As described above the body region of an active area 330*a* of a selection transistor is located on and galvanically coupled to the plate 320 which serves as a source plate electrode. The upper end of the body region of active area 330*a* of the selection transistor is coupled to a drain 360*a*, which in turn is galvanically coupled to a bottom electrode 370*a* being in turn coupled to a volume of switching active material 380*a*.

In this embodiment, a first gate electrode and thus a first wordline is located in front of the paper plane of the drawing as indicated by the dotted line and reference numeral 340*a* and a second gate electrode, in other words a second wordline, is located behind the paper plane, the two gates thus forming a double gate electrode for active area 330*a*.

A shallow trench insulation (STI) 350 runs in an insulation trench parallel to bit lines 390, thus insulating active areas of transistors of memory cells coupled to different bitlines.

In this embodiment, the insulation trench does not extend into the source plate electrode 320, so that body regions of adjacent transistors are electrically coupled in a lower region of the active areas. Consequently when operating the transistor charge carriers can dissipate from one active area into neighbouring active areas thus preventing an accumulation of charge carriers in one active area and thus preventing the impacts of a floating body transistor.

However, in a variation the depth of the STI can extend into the source plate electrode 320 thus forming isolated pillars of Si emerging from the source plate electrode 320.

The structure as illustrated in and described with reference to FIGS. 3a, 3b thus describes a vertical double gate transistor, wherein vertical describes the direction of the current flow from the source plate electrode 320 through the transistor body part of 330a, 330b and a drain 360a, 360b to a bottom electrode 370a, 370b coupled to a volume of switching active material 380a, 380b, which is coupled to a bitline 390 (390a/390b).

The gate electrodes 340a, 340b form a double gate electrode for each selection transistor at the sidewalls of an active area 330a, 330b, providing the advantages described above. As the gate electrodes 340a, 340b are formed as stripes, they form wordlines running perpendicular to the bitlines 390. As each wordline can be coupled independently to a voltage, the two gates at the sidewalls of the active area of a selection transistor can be biased independently.

Figure 4:
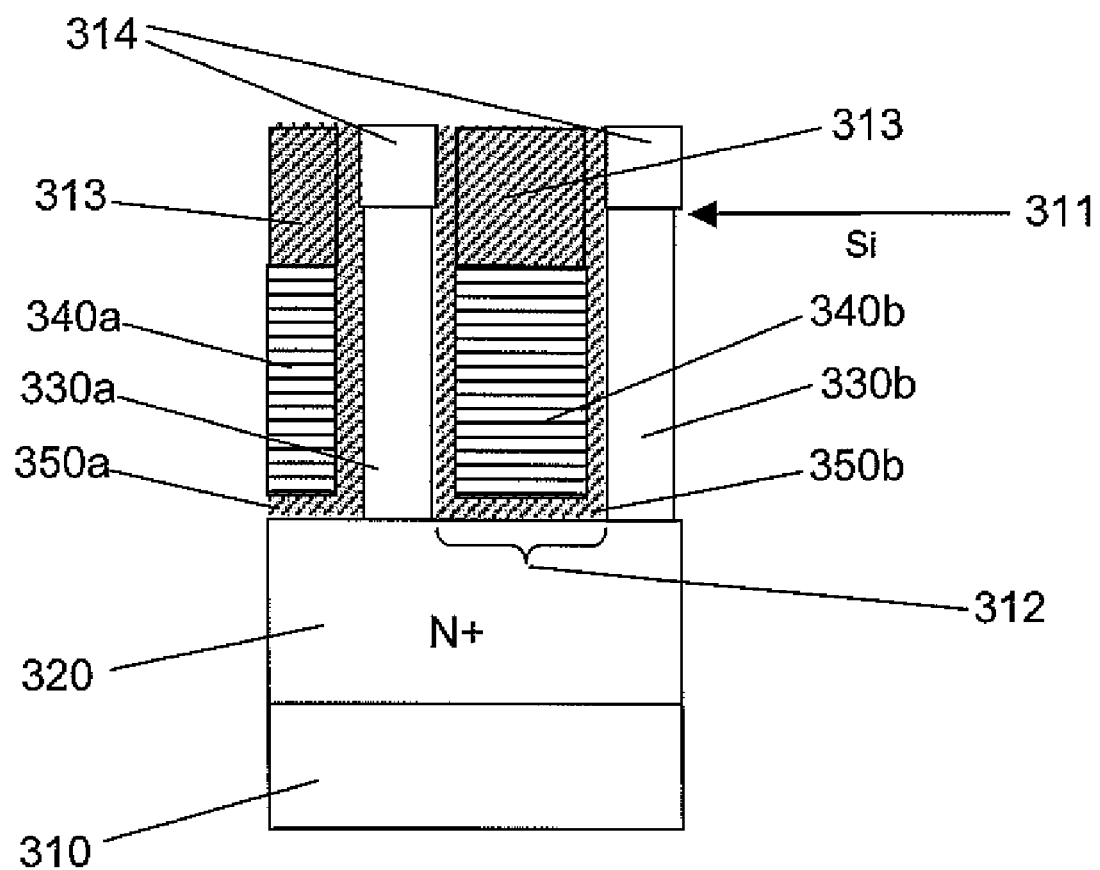
FIG. 4 illustrates a schematic cross sectional view of a memory cell at a processing stage.

FIG. 4 illustrates a cross section through a structure when producing the selection transistors on a silicon wafer. The direction of the cut line is parallel to a bitline and thus similar as in FIG. 3a. The reference numerals are the same as in FIG. 3a where appropriate.

The production of the structure illustrated starts at the surface of a silicon wafer 310, wherein the plane of the original top surface of the wafer is denoted by arrow 311.

Starting with a weakly doped substrate, the wafer receives an N+ implantation to produce a N+ doped layer which will serve as a source plate electrode 320, wherein the N+ must be implanted deeply into the wafer material, namely the Si of the wafer. This can be either achieved by a high-energy implant, which transports the N+ deeply into the Si, or by an implant and an epitaxial growth of p-type doped Si on the surface so as to cover the N+ implanted layer by a Si deposit.

The conductive layer may be part of the original substrate. For this, a p-type epitaxial layer is deposited on top of an n+-type substrate wafer.

The source plate electrode serves to couple the source of a transistor to an appropriate source voltage, thus a corresponding source voltage is applied to the source plate electrode, e.g., ground potential.

On the surface of the wafer a pad oxide and pad nitride—as denoted by reference numeral 314—and an optional hardmask layer can be deposited on the surface in a conventional manner for protection purposes and as patterning means.

In a next process an insulation trench for a shallow trench isolation (STI) is etched. In this drawing the insulation trench is not illustrated as it runs parallel to the paper plane and in front of or behind the paper plane. As can be seen in FIG. 3b and denoted by reference sign 350a the depth of STI trench is at least half of the channel length of the transistor and may extend into the N+ doped source plate electrode. This trench is filled with a conventional material suitable for a shallow trench insulation, for example an oxide as SiO.

In a subsequent process word line trenches for word lines are etched into the Si and isolation trenches using a conventional lithographic and etching method. The width of a trench is denoted by reference numeral 312. As the word line trenches are perpendicular to the insulation trenches these trenches cross the insulation trenches filled with an oxide, so that when etching the wafer material the STI material is to be etched also. The etching process may be stopped before reaching the source plate electrode or the word line trench may extend into the source plate 320. In this way the word line trenches form stripes of substrate material, which serve as active areas 330a and 330b of the transistors. These stripes are separated into transistor cells by the residual pieces of the insulation trenches. So the word lines separate the transistor cells in a first direction and the residual pieces of the insulation trenches separate the transistor cells in the direction of the word line trenches.

The active areas can be further thinned in order to optimize the cooperation of the gate electrodes being positioned at opposite sidewalls of an active area. Another effect of thinning the active areas is that more space is produced for generating the gate oxide layer and the gate electrodes. A sacrificial oxidation can be made optionally to generate a thin oxide layer protecting the active areas in subsequent processing steps and removing etch damage from the Si surface.

If the etching of the wordline trenches is stopped before the source plate electrode 320 is reached then the bottom of the trench is vertically N+ implanted with an optional sacrificial sidewall spacer so as to galvanically couple the bottom of the trench to the source plate electrode 320.

At this processing stage further implantations can be made, for example for generating and adjusting the n-p transitions in the transistors.

The sacrificial oxide layer is removed and the inner sidewalls of wordline trenches are oxidized, that is a liner of electrically insulating oxide is provided, to form a liner of gate oxide in the wordline trench.

Then the material of the gates 340a, 340b being the material of the wordline is deposited and filled into the trenches. In order to provide a good conductivity of the wordline this material preferably is a metal, e.g., such as tungsten (W). However, if processing of a metal to fill the wordline trenches turns out to be to complex or to costly the poly Si could be used as wordline material.

The gate electrode material, which is the wordline material, is planarized with reference to the pad nitride using a conventional processing method, for example a conventional chemical/mechanical polishing (CMP) process.

Further on the gate electrode material is recessed, so that the height of the wordline, which is also the height of the gate electrodes of a selection transistor, is defined as illustrated in the drawing, so that the top surface of the wordline lies under the original top surface of the wafer as denoted by arrow 311.

A device implant can be performed for doping the drain of the transistor.

After the gate electrode/wordline material has been recessed to the height as illustrated in the drawing, the wordlines/gate electrodes 340a and 340b are covered by an electrically insulating oxide cap as indicated by reference numeral 313.

In subsequent processes—the effects are not illustrated in FIG. 4—the pad nitride and oxide 314 is removed in order to bare the top surface of the active area 330a, 330b. An optional N+ device implant can be performed for doping the top of an active area 330a, 330b. Furthermore another layer of Si can be deposited by selective epitaxial growth in order to widen the contact area of the active area 330a, 330b of a transistor.

The bottom electrode contact for contacting a volume of phase change material can be formed in a conventional manner above the active area 330a, 330b. Also the volumes of phase change material and the bitlines can be formed using conventional method steps.

In this way the wordline being formed by the gate electrodes 340a and 340b is formed below the top surface of the original wafer and is thus buried. Moreover, the source plate electrode 320, the active areas 330a, 330b and the gate electrodes forming the wordlines are placed below the surface 311 of the original wafer.

However, as it is desired to provide a wordline having a good conductivity and if it proves to be to complex or costly to produce a buried metal wordline, a second structure is provided proposing a double gate memory cell having a conventional wordline stack structure as described in the following.

Figure 5:
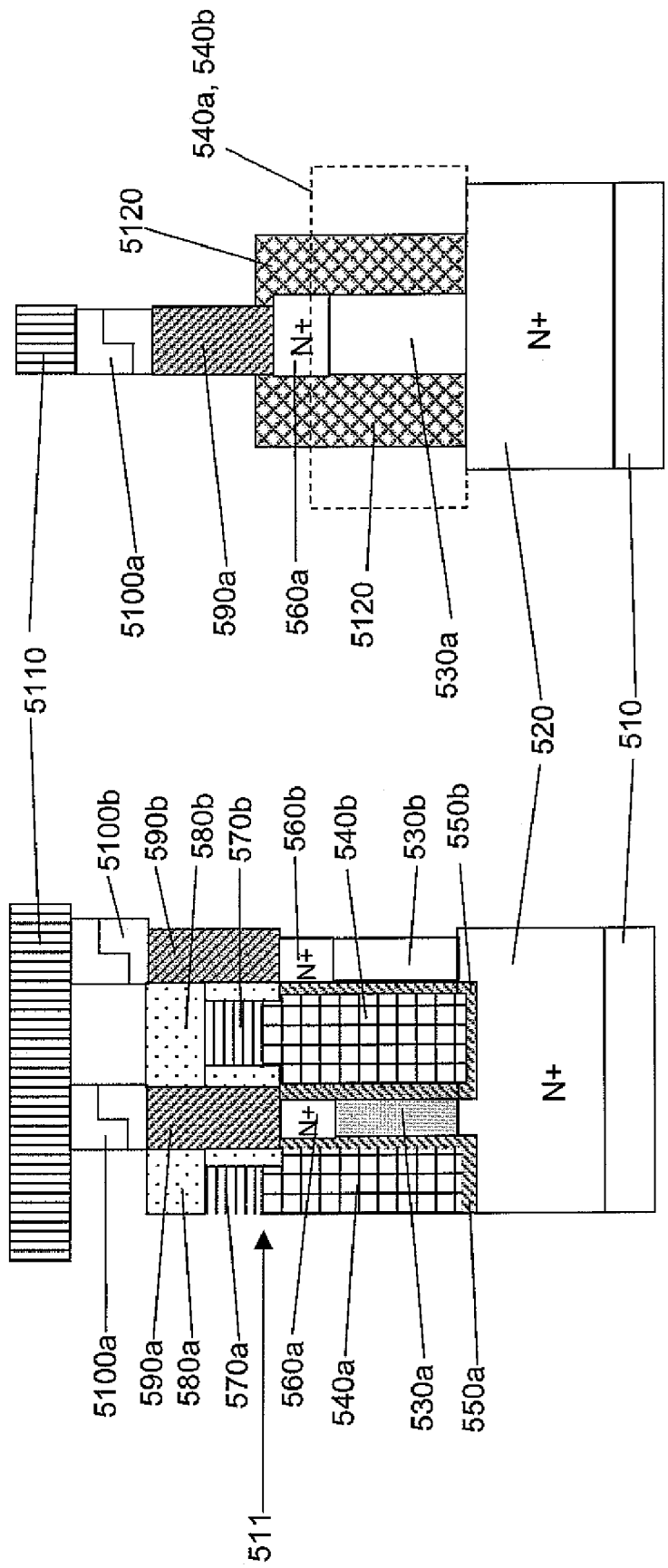
FIGS. 5a and 5b illustrate schematic cross sectional views of a variation of a memory cell.

FIGS. 5a and 5b illustrate a structure having similarities with that of FIGS. 3a and 3b with the exception of the conventional wordline stack structure.

FIG. 5a illustrates a cross section through a memory cell wherein the cut line is parallel to a bitline. A layer of N+ doped silicon on a wafer of Si 510 serves as a source plate electrode 520, onto which a vertical transistor including a p-type doped body region 530a or 530b and an N type doped drain 560a, 560b is formed.

A gate oxide liner 550a, 550b insulates a gate electrode 540a, 540b from the active areas 530a, 530b and the source plate electrode 520 and the drain area 560a,b. The gate electrodes 540a and 540b form a double gate electrode for the transistor having the active area 530a.

In this embodiment the material of the gate electrodes 540a, 540b is poly silicon (poly Si). This has the advantage that poly Si is less complex to process when forming the gate electrodes, in particular when filling a trench.

However, as the conductivity of poly Si is significantly less than the conductivity of a metal and because a good conductivity is desired for a wordline connecting a plurality of gate electrodes, it is insufficient to form a wordline from the gate electrodes and consequently from the material of the gate electrodes 540a, 540b, which in this embodiment is poly Si.

In order to improve the conductivity of the wordlines in this embodiment a gate conductor 570a, 570b of a good conducting material, for example a metal, is formed on top of the poly Si gate electrodes 540a and 540b. This layer 570a, 570b is located above the top surface—denoted by 511—of the original wafer, so that in this embodiment the wordline is not buried under the top surface of the wafer. As in this view the gate electrodes are running into the paper plane the gate conductor 570a, 570b also runs into the paper plane.

With the exception of the galvanic coupling to the gate electrodes the gate conductors 570a, 570b are embedded in an electrically insulating material 580a, 580b to electrically insulate them from surrounding elements, for example from bottom electrode contacts 590a, 590b.

The bottom electrode contacts 590a, 590b each contact a volume of phase change material 5100a, 5100b at the lower side, which in turn are coupled directly to a bitline 5110.

FIG. 5b illustrates the structure of a memory cell and an associated selection transistor in a cross sectional view through the memory cell and perpendicular to a bitline and thus perpendicular to the view as in FIG. 5a.

As described with reference to FIG. 5a on a wafer of Si 510 there is a layer of N+ doped silicon 520 serving as a source plate electrode. A pillar of weakly p-type doped Si being the body of active area 530a of the selection transistor extends from the source plate electrode 520. A N+ doped drain 560a is placed on the body of the transistor and couples to the bottom electrode 590a of a memory cell, which includes a volume of phase change or switching active material 5100a being in turn coupled to a bitline 5110.

The dashed line of the gate electrodes 540a, 540b shall indicate, that in this view one gate electrode is located in front of and the other is located behind the paper plane.

An insulation trench for a shallow trench isolation (STI) 5120 electrically separates the active area 530a from surrounding elements, in particular from the drains of adjacent selection transistors.

It is to be noted that in this embodiment the shallow trench isolation 5120 extends into or reaches the source plate electrode 520 and thus separates the active area 530a of the illustrated selection transistor from the active area of an adjacent transistor. In a variation—not illustrated—of this structure the depth of the trench of this STI shall reach down to at least below the drain area of the transistor but may stop before the source plate electrode 520, so that the STI does not separate between the active areas of adjacent transistors.

Figure 6:
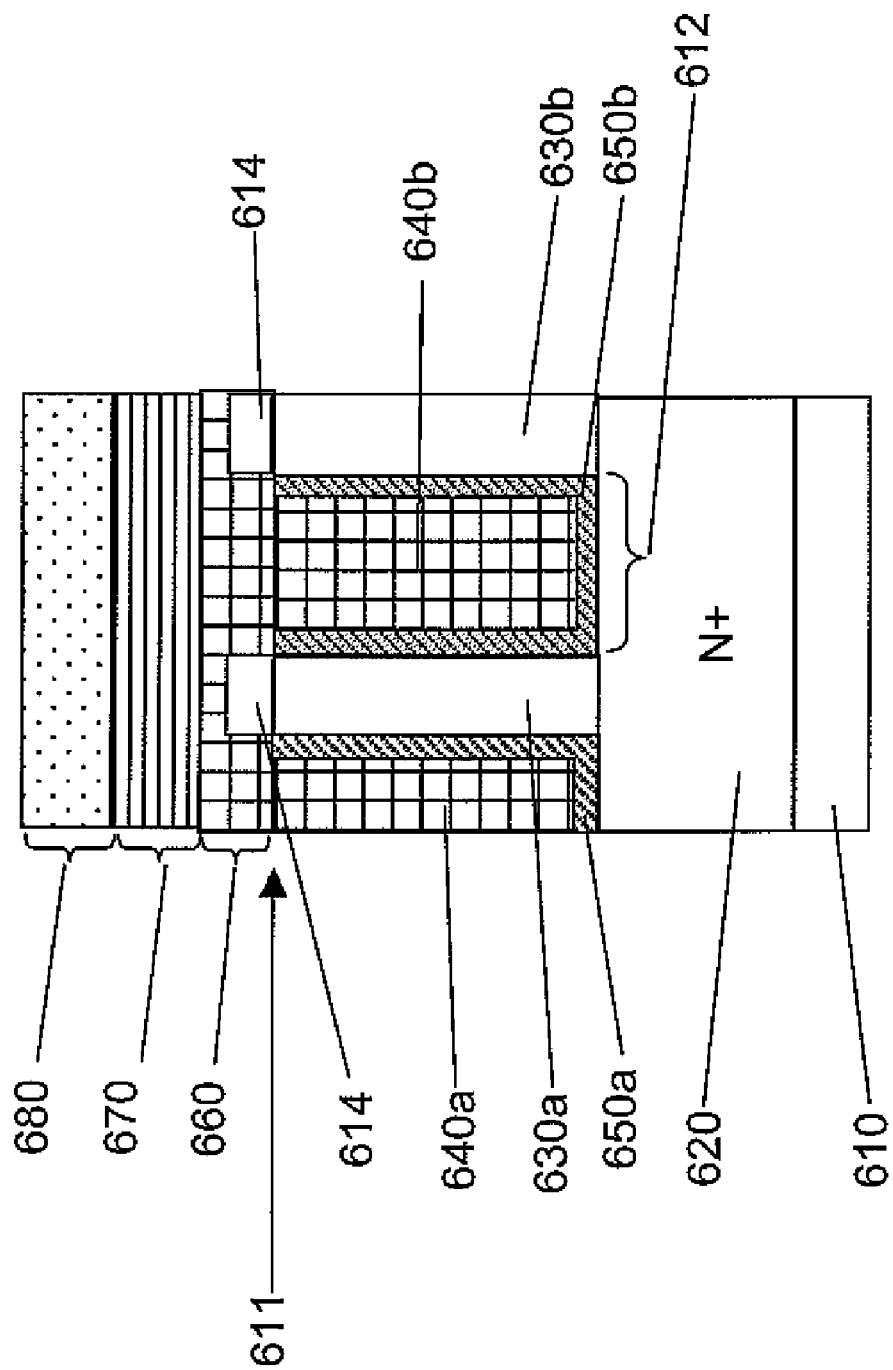
FIG. 6 illustrates a schematic cross sectional view of a variation of a memory cell at a processing stage.

FIG. 6 illustrates a cross sectional view with the cut line being parallel to a bitline and through a transistor, the transistor having a double gate electrode and a conventional wordline, at a processing stage just before the gate conductor is etched.

Similar to the processing described with reference to FIG. 4 the production of the structure starts from an undoped or weakly p-type doped wafer 610 wherein the plane of the original top surface of the wafer is denoted by arrow 611.

As described with reference to FIG. 4 and by performing the same method steps the wafer in this embodiment receives an N+ doped source layer.

Also as described above a pad oxide—denoted by reference numeral 614—and a pad nitride and an optional hardmask layer—none of the layers illustrated—can be deposited on the surface in a conventional manner for protection purposes and as patterning means.

In a subsequent processing step insulation trenches for a shallow trench isolation (STI) between the active areas of adjacent transistors are etched using conventional lithographic and etching methods. These trenches are not illustrated in the drawing as they run parallel to the bitlines and are located in front of and behind the paper plane of this drawing. As mentioned above with regard to FIG. 5b the depth of the trench for the STI at least must be below the drain of the transistor and may end before reaching the source plate electrode 620 or may extend into it. The trenches for the STI are filled with a suitable insulation material, which typically may be an oxide such as SiO using a conventional method.

Then wordline trenches running perpendicular to the insulation trenches and perpendicular to bitlines are formed using conventional lithographic and etching processing steps. As these trenches run perpendicular to the insulation trenches the Si of the wafer and the oxide of the STI must be etched. In the drawing the wordline trenches run into the paper plane and the width is indicated by reference numeral 612. The depth of the wordline trenches may either extend into or may stop above the source plate electrode 620.

In this way, that is by etching the insulation trenches and the perpendicular wordline trenches pillars of Si have been produced which will serve as active areas 630a, 630b of selection transistors to be formed.

As described above after forming the active areas, the Si can be optionally thinned by isotropic etching and the pad nitride and optionally the pad oxide may be removed. Then a sacrificial oxide layer can be produced optionally serving as a protection in subsequent processing steps, and which will be removed before the gate oxide for the transistor is produced or deposited.

In case that the wordline trenches do not extend into the source plate electrode, the bottom of the wordline trenches is N+ implanted to galvanically connect the bottom of a wordline trench to the source plate electrode 620, whereby a sacrificial sidewall spacer—not illustrated—can be formed optionally in the wordline trench to ensure that the bottom only is implanted.

Also at this processing stage further implantations can be made in order to generate or adjust the pn transitions of the transistors.

Before generating the layer serving as gate oxide the optional sacrificial oxide layer—if produced—must be removed. Then a layer of electrically insulating material, typically an oxide such as SiO will be formed at the Si sidewalls of the active area to form a liner of insulating material which will serve as a gate oxide layer 650*a*, 650*b*.

After the gate oxide layer has been formed the remaining of the wordline trenches is filled with poly Si to form the gate electrodes 640*a* and 640*b*. In this drawing the gate electrodes 640*a* and 640*b* form the double gate for the active area 630*a*. The deposited gate electrode material optionally may be planarized to the pad nitride layer by using a conventional planarization process such as chemical-mechanical polishing (CMP).

Different from the processing as described in the method steps for producing the buried metal wordline the pad nitride is removed leaving the thick pad oxide 614 on the top surface of the chip.

The layers for the gate conductor are deposited. That is an optional layer of poly Si 660, a layer of a metal 670 to form the wordline from and a layer of insulating silicon nitride (SiN) 680 are deposited in this order onto the surface of the chip using conventional deposition methods.

This stack of layers is processed by using conventional lithographic and etching process to form a gate conductor. That is the three layers are shaped into lines positioned on top of the gate electrodes thus providing a conventional wordline made of a metal located on and electrically coupled to the gate electrodes 640*a* and 640*b*.

During and after the three layers have been shaped into lines, suitable liners and sidewall spacers are formed from oxide and/or SiN to electrically insulate the sidewalls of the lines against the active areas 630*a*, 630*b* and bottom electrodes, which will be formed on top of the active areas.

In subsequent method processes active areas 630*a* and 630*b* are coupled to a volume of for example phase change material, which in turn will be connected to a bitline. Correspondingly there can be device implants to N+ dope the active areas and a selective epitaxial growth of Si to widen the contact area of the active areas. At this point, a salicidation process may be used to improve the contact resistance. Areas or volumes between the different functional elements formed so far are filled with an interleveldielectric, which typically is an insulating oxide such as SiO. This layer is then planarized to gate.

By using a contact lithographic and selective etching process is performed, wherein the etching is selective to the SiN covering the gate electrode and the gate conductor respectively, in order to bare the top surface of the active areas.

A device junction implant can be performed in order to improve the conductivity between active areas and bottom electrodes to be formed.

In subsequent processes bottom electrodes are formed on top of the active areas using conventional process. Volumes of phase change material or other suitable switching active material will be formed and coupled to the bottom electrodes with their one end. On top of the volumes of switching active material bitlines will be formed.

Figure 7:
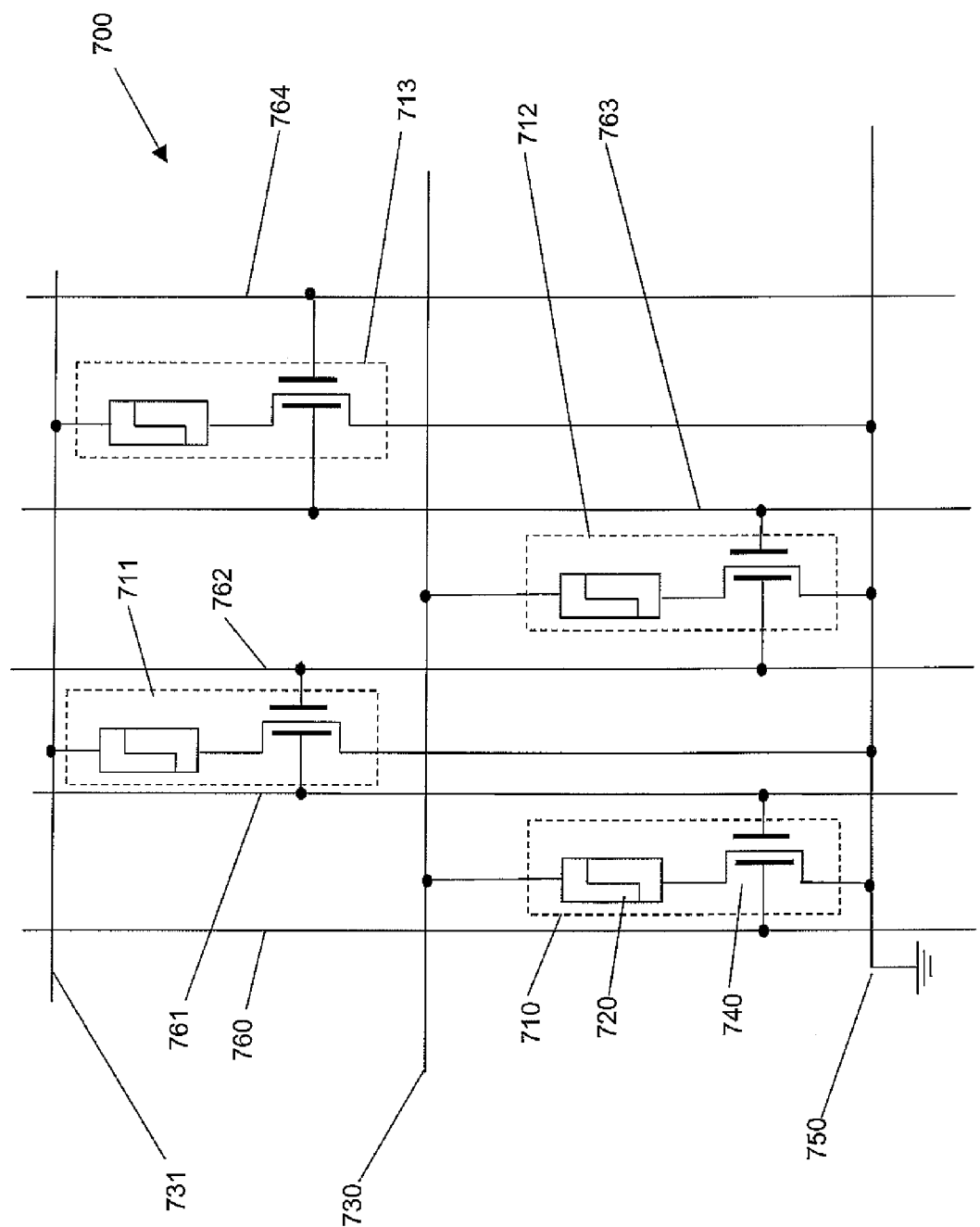
FIG. 7 illustrates a schematic circuit diagram of an alternative embodiment of the invention.

FIG. 7 illustrates a schematic circuit 700 of an embodiment of the invention described above, wherein an array of memory cells is exemplified by four memory cells 710, 711, 712, 713, 714. The memory cells are identical to cell 710 including a volume of resistively switching material 720 and a double gate selection transistor 740. As illustrated all selection transistors are coupled to a common source line being formed as a source plate electrode and which can be coupled to ground potential. The drain of each selection transistor is coupled to the volume of switching active material being in turn coupled to a bit line, such that in this way each memory cell couples a transistor to a bit line via a resistively switching memory element.

The selection transistors are double gate transistors. Each of the gate electrodes of a transistor is coupled to a different word line. Hence in order to open a selection transistor a gate voltage must be applied to two—adjacent—word lines.

The memory cells are arranged such that the drains of selection transistors of adjacent memory cells in the direction of the word lines 760-764, whose gate electrodes are consequently are coupled to the same word lines, are coupled to different bit lines, wherein the next cell is coupled to the next bit line but one.

Also in the direction of the bit lines 730, 731 adjacent memory cells, which are coupled to the same bit line, are coupled to different word lines. So for example cells 710 and 712 are both coupled to bit line 730 and are adjacent to each other in bit line direction. The gate electrodes of the selection transistor of cell 710 are coupled to word lines 760 and 761 respectively and the gate electrodes of the selection transistor of cell 712 are coupled to word lines 762 and 763 respectively.

In this way memory cells coupled to the same bitline are coupled to different word lines and—in other words—cells coupled to the same word lines are coupled to different bit lines.

Hence a memory cell can be selected by selecting one bit line and a pair of word lines, but in contrast to the embodiment described above when selecting a memory cell by applying a voltage to the bit line and the corresponding word lines, the gate voltages of the adjacent memory cell in bit line direction remain unaffected. Consequently there is no need to form the transistors as fully depleted transistors.

The memory cells and thus the corresponding transistor cells are located at crossing points of the pairs of word lines, wherein the cells are arranged like on a checkerboard. That is in word line direction the cells are located at every second crossing point of a pair of word lines and a bit line and furthermore are arranged staggered to the adjacent row of cells by one crossing point, so that also in bit line direction the cells are located at every second crossing point.

Figure 8:
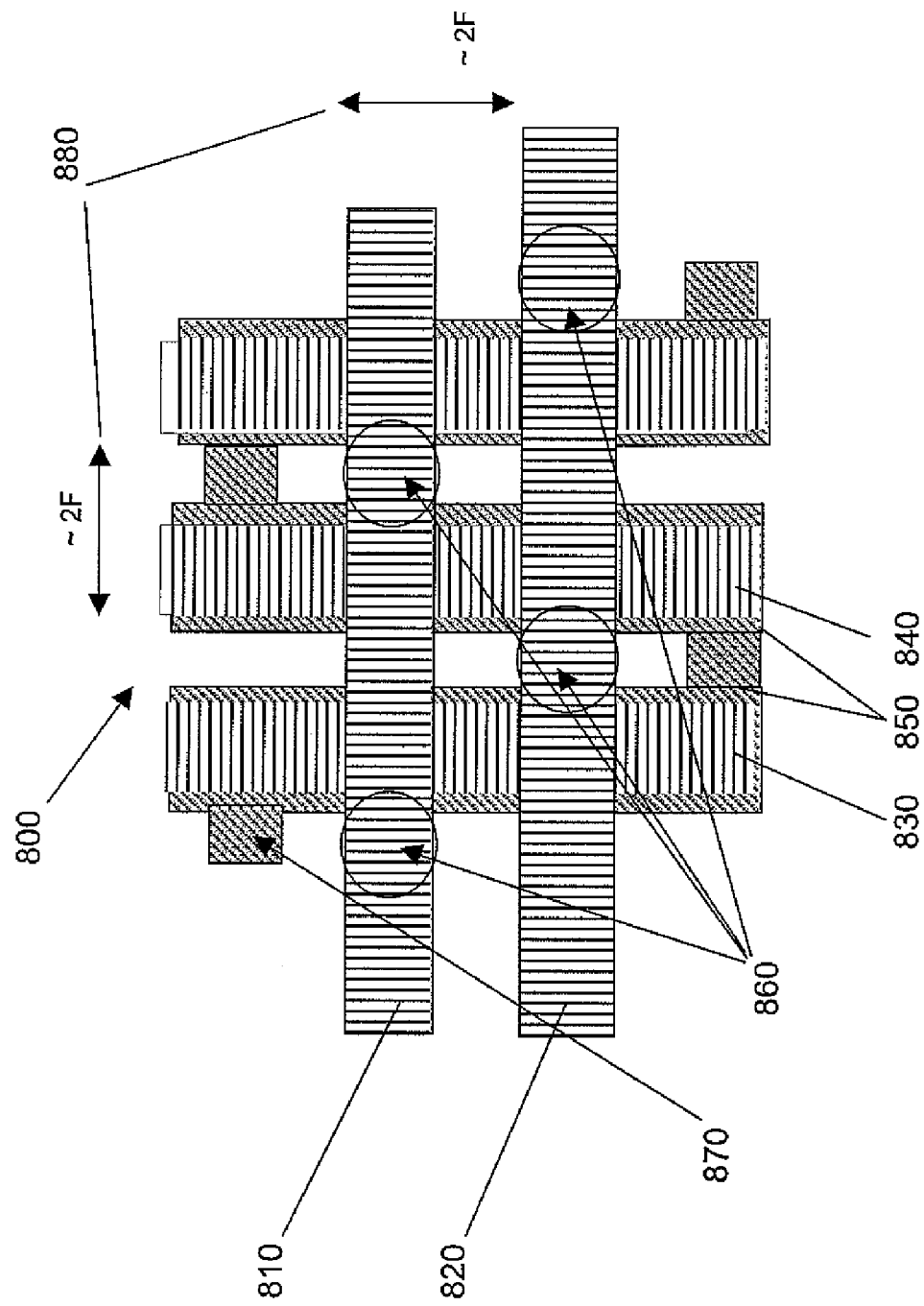
FIG. 8 illustrates a top down view on the alternative array layout of double gate cells

FIG. 8 illustrates a top down view on the variation of the embodiment described above, which is an array of memory cells 800 including double gate transistors and volumes of resistively switching material.

Similar to the embodiment described above a first and a second bit line 810, 820 are the topmost elements in this view, which exemplify a plurality of parallel bit lines and which are located above the surface plane of the original wafer.

A first and a second word line 830, 840 exemplify a plurality of parallel word lines being positioned below the bit lines and at least partially below the surface plane of the original wafer, thus being buried below the surface plane. Each word line forms a plurality of gate electrodes being insulated by a layer of gate dielectric 850, which can be an oxide such as SiO.

Areas between the bitlines and also between the wordlines—referenced by 870—are filled with an insulating material forming a shallow trench isolation (STI).

Reference numeral 860 denotes the location—encircled in the drawing—of the active areas of the transistors, which are positioned below the bit lines and between the word lines.

In this embodiment the active areas are arranged staggered. When compared to the embodiment described above every second transistor is omitted, either in bit line direction or in word line direction.

This layout has the advantage that each transistor and consequently each memory cell including the transistor can be selected by applying an appropriate voltage to one bit line and two word lines, wherein the voltage applied to the word lines leaves the adjacent transistor in bit line direction unaffected, i.e. the gate voltage applied to the word lines does not have impact on a gate electrode of the adjacent transistor. Hence the conductivity of the adjacent transistor is unaffected by selecting the transistor and accordingly the transistors may not be fully depleted transistors.

Reference numerals 880 denote arrows indicating the periodicity of the bit lines and the word lines, each being 2F, although the drawing is not drawn to scale. Accordingly the cell size of a memory cell is approximately 8F2.

FIG. 9a illustrates a cross section through a memory cell including a transistor, wherein the direction of the cut line is in bit line direction.

Similar to the arrangement in FIG. 3a, there is a source plate 920 of N+ doped semi-conducting material in a wafer 910, the source plate for example being coupled to ground potential and serving as a ground plate electrode. A transistor body 930 of slightly doped p-type silicon is coupled with its lower end to the source plate electrode 920 and with its opposing end forming the drain 960 to a bottom electrode 970, which in turn is coupled to a volume of resistively switching material 980. The volume of resistively switching material in turn is coupled to a bit line 990. Word lines 940a, 940b are arranged on opposing sidewalls of transistor body 930 thus forming the gate electrodes of the transistor and are galvanically insulated by gate dielectric 950a, 950b from the transistor body.

As can be seen also from FIG. 7 the gate electrodes abut against insulating material of the shallow trench insulation 9100. So in contrast to the first embodiment adjacent cells in bit line direction do not have a common or shared gate electrode. Instead the adjacent transistor in bit line direction includes a pair of gate electrodes formed by a parallel pair of word lines, which are not illustrated in this view.

FIG. 9b illustrates a cross sectional view through the structure in word line direction, that is perpendicular to the cut line as in FIG. 9a. A transistor body 930, formed from slightly p-doped semiconductor material, of a selection transistor is located on and coupled to a N+ doped source plate electrode 920 being formed in the substrate 910 of a wafer, the lower end of the body 930 thus forming the source of the transistor. The upper end of the transistor body 930 referenced by numeral 960 is N+ doped and forms the drain of the transistor, which is coupled to a bottom electrode 970 being in turn coupled to a volume of resistively switching material 980. The volume of resistively switching material is coupled to bit line 990. The insulating material of a shallow insulation trench 9100 is located at two opposing sidewalls of transistor body 930 thus separating this transistor body from that of an transistor body adjacent in word line direction.

In this view the word lines forming the gate electrodes are located in front of and behind the paper plane. The dotted line 940 shall indicate the location of the gate electrodes in front of and behind the paper plane.

As illustrated in the drawing the dimension of the transistor body 930 is in the direction of the cut line significantly larger than in bit line direction and also larger than that as illustrated in the first embodiment. In this way a transistor body having a bigger cross-sectional area in the direction of the current flow, which in this view is vertically, can be achieved. This is advantageous in particular for resistively switching memory cells, because for changing the resistance in the volume of the resistively switching memory cell a strong current may be necessary. Hence in the exemplified embodiment the dimension of the transistor body in word line direction may be up to 3F.

The described embodiment of an array of vertical transistors can be achieved by either of the two methods described for the first embodiment, but wherein the masks for producing the transistors and for producing the memory elements are amended such that every second cell is omitted in order to achieve a staggered arrangement of memory cells like on a checkerboard.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
    an array of transistors in a substrate for selecting one of a plurality of memory cells, each memory cell coupling a transistor to a bit line via a memory element and being addressable by selecting two word lines and a bit line,
    the array of transistors formed by a plurality of word line trenches forming stripes of substrate material serving as active areas of the transistors, the stripes separated by pieces of insulation trenches, thus the word line trenches separating transistor cells in a first direction and the pieces of insulation trenches separating transistor cells in the direction of word line trenches; wherein
    one word line trench takes one word line; and wherein
    a first word line in a first word line trench forms a plurality of gate electrodes on one sidewall of active areas of a first and a second, adjacent row of transistor cells in word line direction; and wherein
    a second word line in an adjacent word line trench forms a plurality of gate electrodes on the opposite sidewall of active areas of the second and of a third row of transistor cells in wordline direction.

2. The memory of claim 1, comprising the surface of the substrate forming a reference plane, wherein each body of a transistor is arranged vertically above the source and the drain is arranged vertically above the body of the transistor.

3. The memory of claim 1, wherein the word lines are buried below the surface plane of the original wafer the transistor array is formed in.

4. The memory of claim 2, wherein a layer within the substrate is doped with a dopant to form a conducting layer and wherein the sources or drains of the vertical transistors are coupled to the conducting layer.

5. The memory of claim 4, wherein the conducting layer is coupled to ground potential thus forming a source plate electrode.

6. The memory of claim 1, wherein each transistor is designed such that a considerable current flow in a transistor cell of the second row of transistor cells is achieved only if at the same time a gate voltage is applied to the first and the second word line to turn the transistor on.

7. The memory of claim 1, wherein the material of the wordlines is a metal.

8. The memory of claim 1, wherein the memory cell is a resistive switching memory cell and the memory element is a volume of resistive switching material accordingly.

9. The memory of claim 1, wherein the memory cell is a phase change memory cell and the memory element is a volume of phase change material accordingly.

10. The memory of claim 1, wherein the vertical extension of the insulation trenches is chosen to fully insulate the body regions of adjacent transistor cells against each other.

11. The memory of claim 1, wherein the vertical extension of the insulation trenches is less than the body of a transistor cell thus allowing a flow of charge carriers between body regions of adjacent transistor cells.

12. A memory comprising:
an array of vertical transistors in a substrate for selecting one of a plurality of memory cells, each memory cell coupling a transistor cell to a bit line via a memory element and being addressable by selecting two word lines and the bit line;
the array of vertical transistors formed by a plurality of word line trenches forming stripes of substrate material serving as active areas of the transistors, the stripes separated by pieces of insulation trenches, thus the word line trenches separating transistor cells in a first direction and the pieces of insulation trenches separating transistor cells in the direction of word line trenches; wherein
one word line trench takes one line of gate electrodes of one line of adjacent transistor cells in wordline direction, the gate electrodes being electrically coupled to a gate conductor positioned above the wordline trench; wherein
a first line of gate electrodes in a first word line trench forms a plurality of gate electrodes on one sidewall of active areas of a first and a second, adjacent row of transistor cells in word line direction; and wherein
a second line of gate electrodes in an adjacent word line trench forms a plurality of gate electrodes on the opposite sidewall of active areas of the second and of a third row of transistor cells in wordline direction.

13. The memory of claim 12 wherein the material of the gate electrodes is poly silicon and the material of the gate conductor contains a metal.

14. The memory of claim 13 wherein the material of the gate conductor is or contains tungsten.

15. The memory of claim 12, wherein the gate electrodes are buried below the surface plane of the original wafer the transistor array is formed in.

16. The memory of claim 12, wherein a layer within the substrate is doped with a dopant to form a conducting layer and wherein the sources or drains of the vertical transistors are coupled to the conducting layer.

17. The memory of claim 16, wherein the conducting layer is coupled to ground potential thus forming a source plate electrode.

18. The memory of claim 12, wherein each transistor is designed such that a considerable current flow in a transistor cell of the second row of transistor cells is achieved only if at the same time a gate voltage is applied to the first and the second word line.

19. The memory of claim 12, wherein the memory cell is a phase change memory cell and the memory element is a volume of phase change material accordingly.

20. The memory of claim 12, wherein the vertical extension of the insulation trenches is chosen to fully insulate active areas of adjacent transistor cells against each other.

21. The memory of claim 12, wherein the vertical extension of the insulation trenches is less than the active area of a transistor cell thus allowing a flow of charge carriers between active areas of adjacent transistor cells.

22. A memory comprising:
an array of transistors in a substrate for selecting one of a plurality of memory cells, each memory cell coupling a transistor to a bit line via a memory element and being addressable by selecting a pair of word lines and one perpendicular bit line;
the array of transistors formed by a plurality of word line trenches forming stripes of substrate material serving as active areas of the transistors, the stripes separated by pieces of insulation trenches, thus the word line trenches separating transistor cells in a first direction and the pieces of insulation trenches separating transistor cells in the direction of word line trenches; wherein
one word line trench takes one word line; and wherein
a first word line of a pair forming a plurality of gate electrodes on one sidewall of active areas of a row of transistor cells in word line direction, the other word line of the pair forming a plurality of gate electrodes on the opposite sidewall of the active areas of the row of transistor cells in word line direction; and
wherein the transistors are located at every second crossing point of a pair of word lines and a bit line, whereby transistors in an adjacent row are arranged staggered by one bit line, the transistors thus arranged like on a checkerboard.

23. The memory of claim 22, comprising the surface of the substrate forming a reference plane, wherein each body of a transistor is arranged vertically above the source and the drain is arranged vertically above the body of the transistor.

24. The memory of claim 1, wherein the word lines are buried below the surface plane of the original wafer the transistor array is formed in.

25. The memory of claim 23, wherein a layer within the substrate is doped with a dopant to form a conducting layer and wherein the sources or drains of the transistors are coupled to the conducting layer.

26. The memory of claim 25, wherein the conducting layer is coupled to ground potential thus forming a source plate electrode.

27. The memory of claim 22, wherein each transistor is designed such that a considerable current flow in a transistor cell of the second row of transistor cells is achieved only if at the same time a gate voltage is applied to the first and the second word line to turn the transistor on.

28. The memory of claim 22, wherein the material of the wordlines is a metal.

29. The memory of claim 22, wherein the memory cell is a resistive switching memory cell and the memory element is a volume of resistive switching material accordingly.

30. The memory of claim 29, wherein the memory cell is a phase change memory cell and the memory element is a volume of phase change material accordingly.

31. The memory of claim 22, wherein the vertical extension of the insulation trenches is chosen to fully insulate the body regions of adjacent transistor cells against each other.

32. The memory of claim 22, wherein the vertical extension of the insulation trenches is less than the body of a transistor cell thus allowing a flow of charge carriers between body regions of adjacent transistor cells.

33. A memory comprising:
a plurality of memory cells;
means for providing an array of transistors in a substrate for selecting one of the plurality of memory cells, each memory cell coupling a transistor to a bit line via a memory element and being addressable by selecting two word lines and a bit line,
the array of transistors means formed by a plurality of word line trenches forming stripes of substrate material serving as active areas of the transistors, the stripes separated by pieces of insulation trenches, thus the word line trenches separating transistor cells in a first direction and the pieces of insulation trenches separating transistor cells in the direction of word line trenches; wherein
one word line trench takes one word line; and wherein
a first word line in a first word line trench forms a plurality of gate electrodes on one sidewall of active areas of a first and a second, adjacent row of transistor cells in word line direction; and wherein
a second word line in an adjacent word line trench forms a plurality of gate electrodes on the opposite sidewall of active areas of the second and of a third row of transistor cells in wordline direction.

* * * * *